United States Patent
Chern et al.

(10) Patent No.: US 10,317,781 B2
(45) Date of Patent: Jun. 11, 2019

(54) LIGHTING APPARATUS AND LASER DIODE MODULE

(71) Applicant: EVERREADY PRECISION IND. CORP., Kaohsiung (TW)

(72) Inventors: Jyh-Long Chern, Taipei (TW); Chih-Ming Yen, New Taipei (TW)

(73) Assignee: EVERREADY PRECISION IND. CORP., Kaohsiung (TW)

( * ) Notice: Subject to any disclaimer, the term of this patent is extended or adjusted under 35 U.S.C. 154(b) by 918 days.

(21) Appl. No.: 14/860,360

(22) Filed: Sep. 21, 2015

(65) Prior Publication Data
US 2017/0038505 A1    Feb. 9, 2017

(30) Foreign Application Priority Data

Aug. 7, 2015    (TW) .............................. 104125782 A

(51) Int. Cl.
| | |
|---|---|
| G03B 21/20 | (2006.01) |
| G02B 5/18 | (2006.01) |
| H01S 5/022 | (2006.01) |
| H01S 5/40 | (2006.01) |
| G01B 11/25 | (2006.01) |
| G02B 27/20 | (2006.01) |
| G02B 27/42 | (2006.01) |
| H01L 25/075 | (2006.01) |

(52) U.S. Cl.
CPC ...... *G03B 21/2033* (2013.01); *G01B 11/2513* (2013.01); *G02B 5/1866* (2013.01); *G02B 27/20* (2013.01); *G02B 27/425* (2013.01); *G03B 21/2013* (2013.01); *H01S 5/02296* (2013.01); *H01S 5/4093* (2013.01); *H01L 25/0753* (2013.01); *H01S 5/02288* (2013.01); *H01S 5/02292* (2013.01)

(58) Field of Classification Search
CPC .... G02B 5/1866; G02B 27/20; G02B 27/425; G01B 11/2513; H01S 5/02296; H01S 5/4093; H01S 5/02288; H01S 5/02292; H01L 25/0753; G03B 21/2013; G03B 21/2033
See application file for complete search history.

(56) References Cited

U.S. PATENT DOCUMENTS

| | | | | |
|---|---|---|---|---|
| 2011/0195532 A1* | 8/2011 | Lerman | ............... | H01L 25/0753 438/27 |
| 2014/0362565 A1* | 12/2014 | Yao | ..................... | H01L 25/0753 362/223 |
| 2015/0355470 A1* | 12/2015 | Herschbach | ....... | G02B 27/0977 362/11 |

* cited by examiner

*Primary Examiner* — Sultan Chowdhury
*Assistant Examiner* — Magda Cruz
(74) *Attorney, Agent, or Firm* — Muncy, Geissler, Olds & Lowe, P.C.

(57) ABSTRACT

A lighting apparatus includes an optical member with a diffractive optical element. The optical member is directly fixed on a substrate with plural lighting chips. When the lighting apparatus is applied to a laser diode module, the height and volume of the overall laser diode module are reduced. Consequently, the laser diode module is suitably applied to a small-size device.

26 Claims, 4 Drawing Sheets

LIGHTING APPARATUS AND LASER DIODE MODULE

FIELD OF THE INVENTION

The present invention relates to a lighting structure, and more particularly to a lighting apparatus for emitting a structural light.

BACKGROUND OF THE INVENTION

Taiwanese Utility Patent No. M490043 discloses a projection apparatus for projecting plural images. The projection apparatus comprises an outer frame, an optical source module and a diffractive optical element. The optical source module is installed within a lateral end of the outer frame. The diffractive optical element is disposed within the outer frame, and separated from the optical source module. The projection apparatus can project plural images. Consequently, the problem of projecting only a single virtual image by the conventional projection apparatus is overcome.

Although the conventional projection apparatus for projecting plural images is effective to overcome the problem of projecting the single monotonous image, there are still some drawbacks. For example, since the volume of this projection apparatus is large, the applications of the projection apparatus to modern wearable devices, portable communication devices, image capture devices and/or detecting devices are restricted.

SUMMARY OF THE INVENTION

One objective of present invention is to provide a lighting apparatus with small volume. Since an optical member is directly fixed on a substrate to cover plural lighting chips, the height and the volume of the overall lighting apparatus are reduced. Consequently, the lighting apparatus is suitably applicable to wearable devices.

Another objective of present invention is to provide a lighting apparatus with novel type of optical components. The lighting apparatus can be used as a laser diode module for structured lighting. A film-type or layer-type optical component is used for collimating plural laser beams and converting the laser beams into a structured light with a specified pattern. Consequently, the lighting apparatus is suitably employed to a portable image capture device or a portable detecting device.

A further objective of present invention is to provide a compact laser diode module with color option. The laser diode module comprises plural lighting and an optical member with a diffractive optical element. Consequently, plural dot laser beams are collimated and guided as a white light or a colorful structure light.

In accordance with an aspect of the present invention, there is a lighting apparatus to be provided. The lighting apparatus includes a substrate, plural lighting chips and an optical component. The substrate includes a circuit block or body (which could be slim or in multiple-layer printed circuit board). The plural lighting chips are fixed on the substrate. The circuit block on the substrate is related to operations of the plural lighting chips. The covering body is fixed on the substrate. The plural lighting chips are covered by the covering body. The covering body has a surface. The optical component is fixed on the surface of the covering body. After plural light beams emitted by the plural lighting chips pass through the optical component, a structural light pattern is produced.

In an embodiment, the plural light beams emitted by the plural lighting chips include plural laser beams. The plural laser beams have wavelengths in an ultraviolet band, a visible band, an infrared band, a near infrared band, a mid-infrared band, a thermal band or a combination thereof.

In an embodiment, the plural light beams have wavelengths of a red light, a green light and a blue light.

In an embodiment, the optical component is a single-layered film, a multi-layered film or a composite film that is attached on the surface of the covering body.

In an embodiment, the surface of the covering body includes an inner surface and/or an outer surface, wherein the inner surface of the covering body faces the plural lighting chips, and the outer surface of the covering body is exposed outside.

In an embodiment, the plural lighting chips are disposed on a mounting surface of the substrate. A distance between the optical component on the outer surface of the covering body and the mounting surface of the substrate is not larger than 3.0 mm.

In an embodiment, the optical member further includes a diffractive optical element, and the diffractive optical element is disposed on the outer surface of the covering body. The outer surface of the covering body has a light outputting surface for the plural light beams, and a numerical aperture (NA) of the light outputting surface is smaller than 0.65.

In an embodiment, the optical component includes a guiding lens and/or a diffractive optical element.

In an embodiment, the guiding lens is a wedge-bending light guider.

In an embodiment, a distance between every two adjacent ones of the plural lighting chips is smaller than 1.0 mm.

In an embodiment, the surface of the covering body is a flat surface or a curvy surface.

In an embodiment, the circuit block further includes a driving circuit, wherein the plural lighting chips are synchronously or asynchronously driven by the driving circuit, so that a coverage range and a profile of the structural light pattern are changeable.

In an embodiment, the circuit block comprises a driving circuit and one or plural photosensive components.

In an embodiment, the one or plural photosensive components sense light beams with different wavelengths.

In an embodiment, the plural lighting chips are arranged in a ring-shaped configuration, and a diameter of the ring-shaped configuration is not larger than 5.0 mm.

In accordance with another aspect of the present invention, there is provided a laser diode module. The laser diode module includes a substrate, plural lighting chips and an optical member. The plural lighting chips are fixed on the substrate. The optical member covers the plural lighting chip, and comprising a diffractive structure. After plural light beams emitted by the plural lighting chips pass through the diffractive structure, a structural light pattern is produced.

In an embodiment, the plural light beams emitted by the plural lighting chips include plural laser beams. The plural laser beams have wavelengths in an ultraviolet band, a visible band, an infrared band, a near infrared band, a mid-infrared band, a thermal band or a combination thereof.

In an embodiment, the plural light beams have wavelengths of a red light, a green light and a blue light.

In an embodiment, the optical member includes a covering body, and the diffractive structure is a single-layered film, a multi-layered film or a composite film that is attached on an inner surface and/or an outer surface of the covering body. The inner surface of the covering body faces the plural lighting chips. The outer surface of the covering body is exposed outside.

In an embodiment, the plural lighting chips are disposed on a mounting surface of the substrate. If the diffractive structure is attached on the outer surface of the covering body, a distance between a climax of the diffractive structure and the mounting surface of the substrate is not larger than 3.0 mm. If the diffractive structure is attached on the inner surface of the covering body, a distance between the outer surface of the covering body and the mounting surface of the substrate is not larger than 3.0 mm.

In an embodiment, the optical member further includes a guiding lens, and guiding lens is fixed on the inner surface or the outer surface of the covering body. Moreover, one of the guiding lens and the diffractive structure is disposed on the inner surface of the covering body, and the other of the guiding lens and the diffractive structure is disposed on the outer surface of the covering body.

In an embodiment, the optical member has a light outputting surface for the plural light beams, and a numerical aperture (N.A.) of the light outputting surface is smaller than 0.65.

In an embodiment, the optical member has a light outputting surface for the plural light beams, and a numerical aperture (N.A.) of the light outputting surface is smaller than 0.5.

In an embodiment, the optical axel of the plural lighting chips are in parallel with each other, or an included angle between every two adjacent ones of the plural optical axes is not larger than 5 degrees.

In an embodiment, the optical member further includes a wedge-bending light guider. Moreover, one of the diffractive structure and the wedge-bending light guider is disposed on an inner surface of the covering body, and the other of the diffractive structure and the wedge-bending light guider is disposed on the outer surface of the covering body. The inner surface of the covering body faces the plural lighting chips. The outer surface of the covering body is exposed outside. An inclination angle of the wedge-bending light guider is smaller than 15 degrees.

In an embodiment, a distance between every two adjacent ones of the lighting chips is smaller than 1.0 mm, or the plural lighting chips are arranged in a ring-shaped configuration with a diameter not larger than 5.0 mm.

In an embodiment, the substrate further includes a driving circuit for driving the plural lighting chips. The plural lighting chips are synchronously or asynchronously driven by the driving circuit, so that a coverage range and a profile of the structural light pattern are changeable or replaceable.

In an embodiment, the structural light pattern is composed of random dots, symmetric non-interlaced stripes, asymmetric non-interlaced stripes, symmetric interlaced stripes or asymmetric interlaced stripes. When the plural lighting chips are synchronously driven by the driving circuit, a density of the random dots is increased or a distribution range of the random dots is widened, a density of the symmetric non-interlaced stripes or a light stripe density or a distribution range of the asymmetric non-interlaced stripes is increased, and a density of the symmetric interlaced stripes or a light stripe density or a distribution range of the asymmetric interlaced stripes is increased.

In an embodiment, the structural light pattern is composed of random dots, symmetric non-interlaced stripes, asymmetric non-interlaced stripes, symmetric interlaced stripes or asymmetric interlaced stripes. When the plural lighting chips are asynchronously driven by the driving circuit, a viewing block corresponding to the structural light pattern is partially or completely scanned.

From the above descriptions, the present invention provides a lighting apparatus. An optical member with a diffractive optical element is directly fixed on the substrate with the lighting chips. When the lighting apparatus is used as a laser diode module, the height and volume of the overall module are reduced. Consequently, the lighting apparatus is suitably used in small-sized devices which are demanded emergently.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
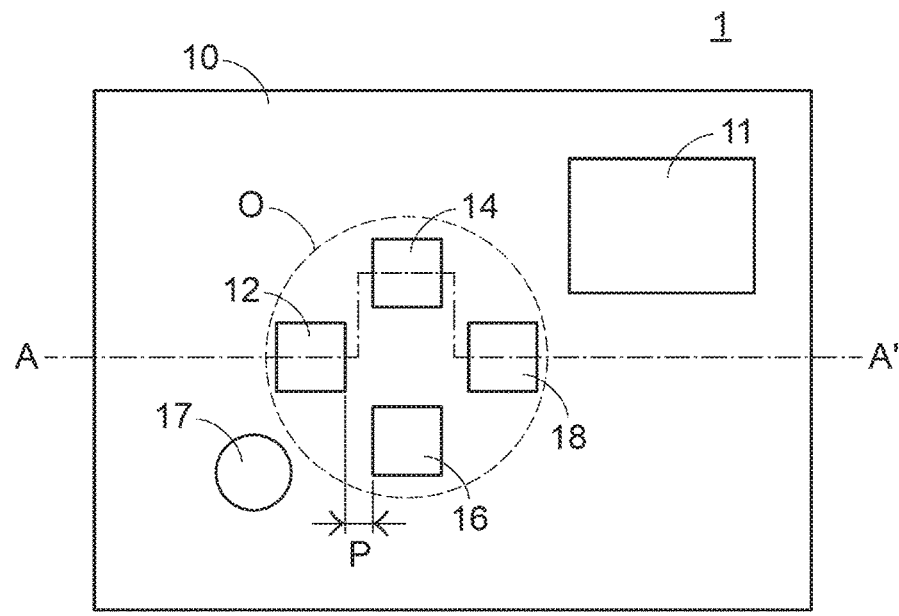
FIG. 1 is a schematic top view illustrating a substrate and lighting chips of a lighting apparatus according to an embodiment of the present invention.

The term "substrate" used herein indicates a printed circuit board (PCB), wherein one or more circuit blocks for implementing specified functions or plural conductive traces for communicating these circuit blocks are mounted thereon. Alternatively, the substrate is a combination of a printed circuit board and a flexible circuit board or a combination of a printed circuit board and a non-rigid circuit board. For example, the substrate is a heat-dissipation metal plate or a sapphire substrate. The term "circuit block" used herein comprises plural conductive traces, active or passive components (e.g., one or more photosensitive components or one or more optical components) or integrated circuits. For example, the circuit block is driving circuit for driving chips. Moreover, other circuits, active or passive components (e.g., one or more photosensitive components or one or more optical components) or other integrated circuits are mounted on the substrate.

The term "lighting chip" used herein indicates the chip for emitting a laser beam (e.g., a semiconductor laser chip). In particular, the lighting chip emits a laser beam with a specified wavelength. For example, the laser beam is an ultraviolet laser beam, a visible laser beam, an infrared laser beam, a near infrared laser beam or a mid-infrared (MIR) laser beam. The visible laser beam at least comprises a red light, a green light and a blue light. Alternatively, the lighting chip emits a laser-like beam with a thermal band or a mixed laser-like beam with the above specified wavelengths. The laser-like source means that the coherence is incomplete, and can be classified as a source of partial coherence. The wavelength band is not a single sharp band, but with broad band/multiple peaks. According to the desired arrangement, the type of the lighting chip includes an edge emitting laser (EEL) chip or a vertical-cavity surface-emitting laser (VCSEL) chip.

The term "optical member" used herein is a component for receiving the laser beam, converting the laser beam and outputting the converted laser beam. Moreover, the lighting chip fixed on the substrate is partially or completely covered by the optical member. When the lighting chip is covered by the optical member, the lighting chip and the optical member are separated from each other by a specified distance. The optical member comprises a covering body and an optical component fixed on the covering body. The optical member comprises a covering body and an optical component fixed on the covering body. The optical component is an optical structure that is directly formed on the covering body by a physical method or a chemical method; or the optical component is an object that is fixed on the covering body by an attaching means, an adhering means or any other appropriate fixing means. Moreover, the covering body, the optical component or the optical member is made of a light-transmissible material. Preferably but not exclusively, the covering body is made of polymethyl methacrylate (PMMA), polycarbonate (PC), K9, BK7, calcium fluoride compound (CaF2), calcium fluoride crystal, sapphire, silicon, quartz glass, crystal, glass or resin. The optical component is directly formed by using the material of the covering body, or the optical component is a coated film attached on the covering body. Moreover, the coated film is a single-layered film, a multi-layered film or a composite film.

Moreover, the shape of the optical member may be determined according to the arrangement of the lighting chips to be covered and the functions of inputting and outputting light beams. For example, the optical member may have a cylindrical shape, a polyhedral shape or any other appropriate shape. Moreover, the optical member is fixed on the substrate by an appropriate means. For example but not exclusively, the optical member is an inset element that is inserted into the corresponding insertion hole of the substrate, or the optical member is fixed on the substrate via an adhesive.

Figure 2:
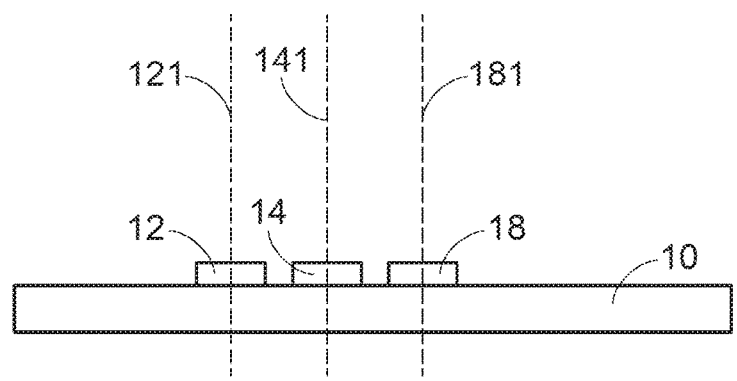
FIG. 2 is a schematic cross-sectional view of the lighting apparatus of FIG. 1 and taken along the line AA'.

FIG. 1 is a schematic top view illustrating a substrate and lighting chips of a lighting apparatus according to an embodiment of the present invention. FIG. 2 is a schematic cross-sectional view of the lighting apparatus of FIG. 1 and taken along the line AA'. As shown in FIGS. 1 and 2, the substrate 10 of the lighting apparatus 1 comprises a circuit block 11 and four lighting chips 12, 14, 16 and 18, which are fixed on the substrate 10. The optical axes of the four lighting chips 12, 14, 16 and 18 are in parallel with each other. For example, as shown in FIG. 2, the optical axes 121, 141 and 181 are in parallel with each other and perpendicular to the substrate 10. In particular, the included angle between every two of the optical axes 121, 141 and 181 is not larger than 5 degrees. It is noted that the optical axes of the lighting chips are not restricted to be perpendicular to the substrate. According to the design or use requirement, the optical axes of the lighting chips are inclined relative to the substrate. That is, a lighting surface of the lighting chip is inclined relative to the substrate at an inclination angle. Moreover, the four lighting chips 12, 14, 16 and 18 are edge emitting laser chips or vertical-cavity surface-emitting laser chips. Consequently, the optical axes defined by the lighting surfaces of the lighting chips 12, 14 and 18 may be guided by other optical elements such as reflective mirrors (not shown) so as to be the optical axes 121, 141 and 181 that are perpendicular to the substrate 10. Similarly, the optical axis defined by the light output surface of the lighting chip 16 may be guided by other optical elements such as reflective mirrors (not shown) so as to be the optical axis that is perpendicular to the substrate 10. For succinctness, the optical axis of the lighting chip 16 that is perpendicular to the substrate 10 is not shown. In an embodiment, the distance P between the lighting chips 12 and 16 is smaller than 1.0 mm. That is, the distance between every two adjacent lighting chips fixed on the substrate 10 is smaller than 1.0 mm. Alternatively, the plural lighting chips are arranged in a ring-shaped configuration O, and a diameter of the ring-shaped configuration O is not larger than 5.0 mm. Since the equivalent area of these lighting chips is very small, the volume is small. Moreover, the function of the circuit block 11 is related to the operations of the lighting chips 12, 14, 16 and 18. For example, the circuit block 11 comprises a driving circuit for driving the lighting chips 12, 14, 16 and 18. In particular, the driving circuit is used for driving the lighting chips 12, 14, 16 and 18 to emit dot laser beams. In addition to the circuit block 11, one or more optical elements are fixed on the substrate 10. For example, one or more photodiodes 17 or other sensing parts or sensing components are fixed on the substrate 10. The photodiodes 17, the sensing parts or the sensing components can sense the light beams with different wavelengths. In case that the photodiode 17 or the sensing component is small, the photodiode 17 or the sensing component can be fixed on the lighting chips 12, 14, 16 or 18.

Figure 3:
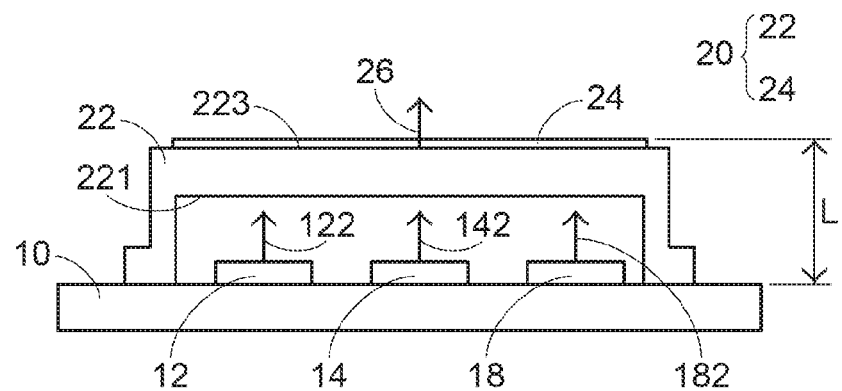
FIG. 3 is a schematic cross-sectional view illustrating the relationship between the substrate, the lighting chips and an optical member of a lighting apparatus according to a first embodiment of the present invention.

FIG. 3 is a schematic cross-sectional view illustrating the relationship between the substrate, the lighting chips and an optical member of a lighting apparatus according to a first embodiment of the present invention. Please refer to FIGS. 1 and 3. The optical member 20 is fixed on the substrate 10. The optical member comprises a covering body 22 that covers the lighting chips 12, 14, 16 and 18. The covering body 22 has an inner surface 221 and an outer surface 223. The inner surface 221 faces the lighting chips 12, 14, 16 and 18. The outer surface 223 is exposed outside. The inner surface 221 and the outer surface 223 are flat surfaces or curvy surfaces. The inner surface 221 of the covering body 22 is separated from the lighting chips 12, 14, 16 and 18 by a specified distance. The optical member 20 further comprises an optical component 24. For example, the optical component 24 is a diffractive optical element (DOE) and used as a guiding lens. The optical component 24 is disposed on the outer surface 223 the covering body 22. Preferably, the distance L between the climax of the optical component 24 and the surface of the substrate 10 that the lighting chips are mounted thereon is not larger than 3.0 mm.

As mentioned above, for reducing the height of the optical member 20, the optical component 24 is a film-type object or a layer-type object formed on the covering body 22 or directly formed on the outer surface 223 of the covering body 22 by a physical method or a chemical method. After the plural light beams 122, 142 and 182 from the lighting chips 12, 14 and 18 and the light beam from the lighting chip 16 (not shown) pass through the optical component 24 of the optical member 20, a structural light pattern 26 is produced. Depending on the diffractive structure of the optical component 24 (especially the diffractive structure for collimating the light beams), the form of the structural light pattern 26 is diversified.

Figure 4:
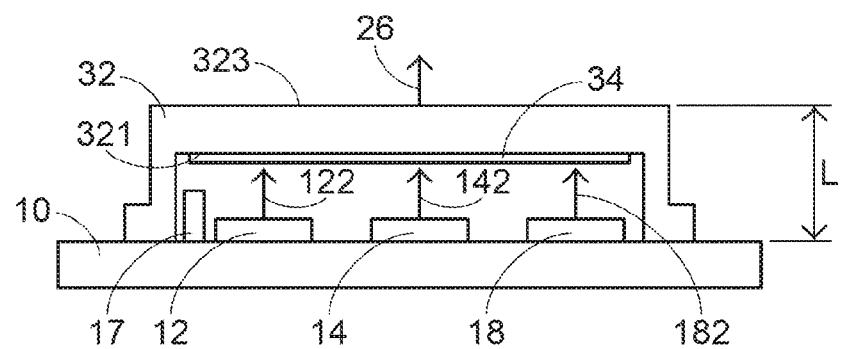
FIG. 4 is a schematic cross-sectional view illustrating the relationship between the substrate, the lighting chips and an optical member of a lighting apparatus according to a second embodiment of the present invention.

FIG. 4 is a schematic cross-sectional view illustrating the relationship between the substrate, the lighting chips and an optical member of a lighting apparatus according to a second embodiment of the present invention. As shown in FIG. 4, the optical component 34 is disposed on the inner surface 321 of the covering body 32. In this embodiment, the distance L between the outer surface 323 of the covering body 32 and the surface of the substrate 10 that the lighting chips are mounted thereon is not larger than 3.0 mm. As mentioned above, the optical member with the covering body is disposed over the lighting chips to cover the lighting chips. After the laser beams from the lighting chips are received by the optical member, the laser beams are collimated and converted into the structural light pattern by the optical member. Consequently, the structural light pattern is outputted from the optical member. Moreover, the covering body of the optical member has a light outputting surface. The numerical aperture (NA) of the light outputting surface of the optical member is smaller than 0.65, and more preferably smaller than 0.5. In other words, the light outputting surface of the optical member has an effective size of at least 0.1 mm so as to provide enough light outputting area to output the structural light pattern.

Figure 5:
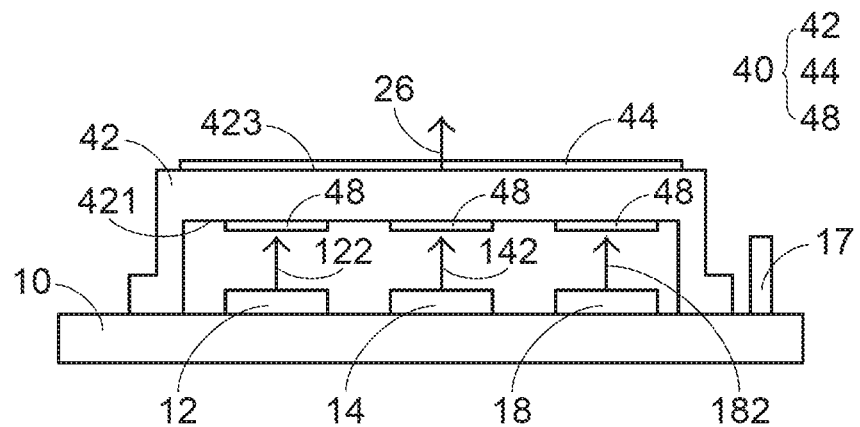
FIG. 5 is a schematic cross-sectional view illustrating the relationship between the substrate, the lighting chips and an optical member of a lighting apparatus according to a third embodiment of the present invention.

FIG. 5 is a schematic cross-sectional view illustrating the relationship between the substrate, the lighting chips and an optical member of a lighting apparatus according to a third embodiment of the present invention. As shown in FIG. 5, the optical member 40 further comprises a diffractive structure 44 and plural guiding lenses 48. The diffractive structure 44 is formed on the outer surface 423 of the covering body 42. The guiding lenses 48 are fixed on the inner surface 421 of the covering body 42. The guiding lenses 48 are coated films, or the guiding lenses 48 are optical structures that are directly formed on the covering body 42. The guiding lenses 48 are used for guiding the plural light beams 122, 142 and 182 from the lighting chips 12, 14 and 18 and the light beam from the lighting chip 16 (not shown). Moreover, in this embodiment, the photodiode 17 or the sensing component is not covered by the covering body 42. It is noted that the guiding lenses 48 are not restricted to the typical light guiding elements as shown in FIG. 5. In some other embodiments, the guiding lenses 48 are wedge-bending light guiders. By the wedge-bending light guiders, the plural light beams 122, 142 and 182 from the lighting chips 12, 14 and 18 and the light beam from the lighting chip 16 (not shown) are translated or corrected. For example, in case that the guiding lenses 48 are wedge-bending light guiders with an inclination angle of 15 degrees, 5-degree deviation of the light beams 122, 142 and 182 from the lighting chips 12, 14 and 18 can be effectively corrected.

Figure 6:
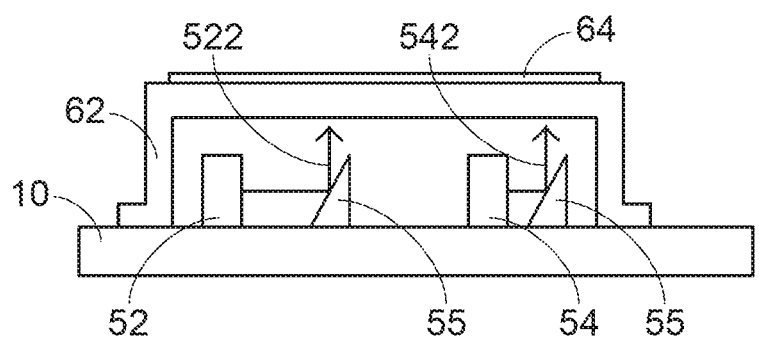
FIG. 6 is a schematic cross-sectional view illustrating the relationship between the substrate, the lighting chips, reflective mirrors and an optical member of a lighting apparatus according to a fourth embodiment of the present invention.

FIG. 6 is a schematic cross-sectional view illustrating the relationship between the substrate, the lighting chips, reflective mirrors and an optical member of a lighting apparatus according to a fourth embodiment of the present invention. As shown in FIG. 6, the lighting surfaces of the lighting chips 52 and 54 fixed on the substrate 10 is not perpendicular to the surface of the substrate 10 that the lighting chips 52 and 54 are fixed thereon. Moreover, two reflective mirrors 55 corresponding to the lighting chips 52 and 54 are also fixed on the substrate 10. The lighting chips 52 and 54 and the two reflective mirrors 55 are covered by the covering body 62. The optical component 64 is disposed on the outer surface of the covering body 62. In this embodiment, the light beams from the lighting chips 52 and 54 are guided by the two reflective mirrors 55 so as to be formed as the light beams 522 and 542. The light beams 522 and 542 are perpendicular to the surface of the substrate 10 that the lighting chips 52 and 54 are fixed thereon.

Figure 7:
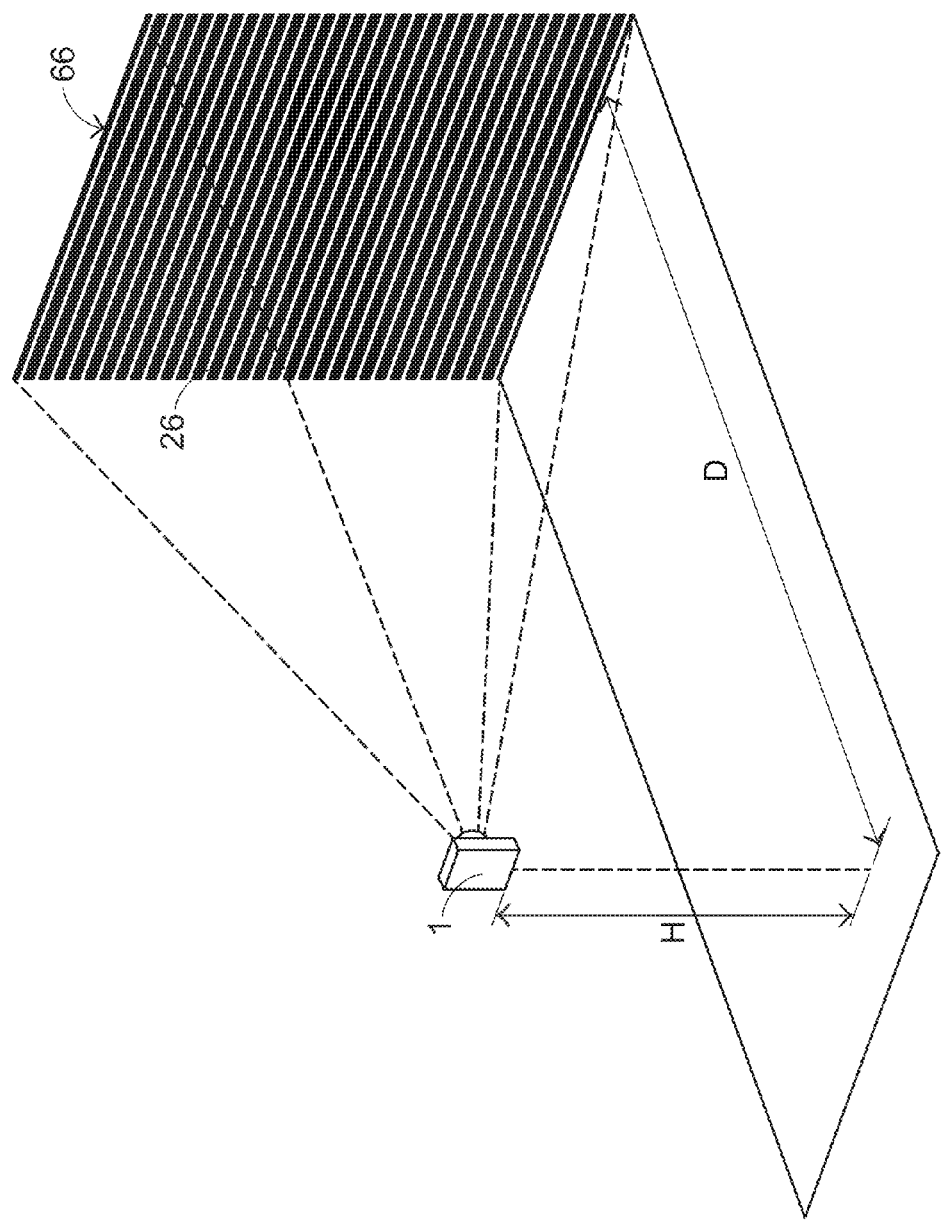
FIG. 7 is a schematic perspective view illustrating the pattern and viewing angle of a structural light from the lighting apparatus of the present invention.

FIG. 7 is a schematic perspective view illustrating the pattern and viewing angle of a structural light from the lighting apparatus of the present invention. Please refer to FIGS. 1, 3 and 7. The altitude of the lighting apparatus 1 with respect to the floor is H. The structural light pattern 26 from the lighting apparatus 1 has a viewing block 66. The distance between the viewing block 66 and the lighting apparatus 1 is D. The structural light pattern 26 is static or dynamic. Moreover, the structural light pattern 26 is regularly or irregularly distributed. In case that the structural light pattern 26 is dynamic, the pattern can be move, rotated, enlarged or shrunken, or the coverage range thereof is variable. In case that the driving methods of the driving circuit of the circuit block 11 are different, the structural light pattern 26 is adjustable. In an embodiment, when the driving current receives electric current, the lighting chips 12, 14, 16 and 18 are synchronously or asynchronously operated. Under this circumstance, the distribution range and the profile of the structural light pattern 26 are changeable. Alternatively, the viewing block 66 corresponding to the structural light pattern 26 is partially or completely scanned. The area of the structural light pattern 26 is smaller than, larger than or equal to the viewing block 66. Moreover, by changing the driving method of the driving circuit, the way of scanning the structural light pattern 26 is changeable. For example, if the lighting chips 12, 14, 16 and 18 are sequentially turned on in an asynchronous order, the viewing block 66 corresponding to the structural light pattern 26 is partially or completely scanned.

In an embodiment, the structural light pattern 26 is composed of random dots. If the lighting chips 12, 14, 16 and 18 are synchronously driven by the driving circuit, the density of the random dots of the structural light pattern 26 is increased or the distribution range of the random dots is widened. In another embodiment, the structural light pattern 26 is composed of symmetric non-interlaced stripes or asymmetric non-interlaced stripes. If the lighting chips 12, 14, 16 and 18 are synchronously driven by the driving circuit, the light stripe density or the distribution range of the structural light pattern 26 is increased. In a further embodiment, the structural light pattern 26 is composed of symmetric interlaced stripes or asymmetric interlaced stripes. If the lighting chips 12, 14, 16 and 18 are synchronously driven by the driving circuit, the light stripe density or the distribution range of the structural light pattern 26 is increased. Moreover, if the lighting chips 12, 14, 16 and 18 are sequentially turned on in an asynchronous order, the viewing block 66 is partially or completely scanned by the structural light pattern 26.

From the above descriptions, the lighting apparatus of the present invention has the following benefits. Firstly, since the optical member with the diffractive optical element is used for directly collimating the plural laser beams, the height and volume of the overall lighting apparatus are reduced. Secondly, since the lighting apparatus comprises plural lighting chips, the plural laser beams from the plural lighting chips can be mixed as a white light or a colorful structure light with various colors. Thirdly, since the optical member is directly fixed on the substrate with the lighting chips, the lighting apparatus of the present invention is suitably applied to a wearable device, a portable image capture device or a portable detecting device.

In addition, the lighting apparatus of the instant disclosure would be put into practice in laser diode module manner, whose width and height are reduced to meet the small-volume demand of an electronic device.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A lighting apparatus, comprising:
   a substrate comprising a circuit block;
   plural lighting chips fixed on the substrate, wherein the circuit block on the substrate is related to operations of the plural lighting chips;
   a covering body fixed on the substrate, wherein the plural lighting chips are covered by the covering body, and the covering body has a surface, wherein the surface of the covering body includes an inner surface and/or an outer surface, wherein the inner surface of the covering body faces the plural lighting chips, and the outer surface of the covering body is exposed outside; and
   an optical component fixed on the surface of the covering body, wherein the optical component comprises a diffractive optical element disposed on the outer surface of the covering body, wherein after plural light beams emitted by the plural lighting chips pass through the optical component, a structural light pattern is produced, wherein the outer surface of the covering body has a light outputting surface for the plural light beams, and a numerical aperture (NA) of the light outputting surface is smaller than 0.65.

2. The lighting apparatus according to claim 1, wherein the plural light beams emitted by the plural lighting chips comprise plural laser beams, wherein the plural laser beams have wavelengths in an ultraviolet band, a visible band, an infrared band, a near infrared band, a mid-infrared band, a thermal band or a combination thereof.

3. The lighting apparatus according to claim 2, wherein the plural light beams have wavelengths of a red light, a green light and a blue light.

4. The lighting apparatus according to claim 1, wherein the optical component is a single-layered film, a multi-layered film or a composite film that is attached on the surface of the covering body.

5. The lighting apparatus according to claim 1, wherein the plural lighting chips are disposed on a mounting surface of the substrate, wherein a distance between the optical component on the outer surface of the covering body and the mounting surface of the substrate is not larger than 3 mm.

6. The lighting apparatus according to claim 1, wherein the optical component further comprises a guiding lens.

7. The lighting apparatus according to claim 6, wherein the guiding lens is a wedge-bending light guider.

8. The lighting apparatus according to claim 1, wherein a distance between every two adjacent ones of the plural lighting chips is smaller than 1.0 mm.

9. The lighting apparatus according to claim 1, wherein the surface of the covering body is a flat surface or a curvy surface.

10. The lighting apparatus according to claim 1, wherein the circuit block further comprises a driving circuit, wherein the plural lighting chips are synchronously or asynchronously driven by the driving circuit, so that a coverage range and a profile of the structural light pattern are changeable.

11. The lighting apparatus according to claim 1, wherein the circuit block comprises a driving circuit and one or plural photosensitive components.

12. The lighting apparatus according to claim 11, wherein the one or plural photosensitive components sense light beams with different wavelengths.

13. The lighting apparatus according to claim 1, wherein the plural lighting chips are arranged in a ring-shaped configuration, and a diameter of the ring-shaped configuration is not larger than 5.0 mm.

14. A laser diode module, comprising:
    a substrate;
    plural lighting chips fixed on the substrate; and
    an optical member covering the plural lighting chip, and comprising a diffractive structure, a covering body and a guiding lens, the guiding lens fixed on an inner surface or an outer surface of the covering body, wherein one of the guiding lens and the diffractive structure is disposed on the inner surface of the covering body, and the other of the guiding lens and the diffractive structure is disposed on the outer surface of the covering body, wherein after plural light beams emitted by the plural lighting chips pass through the diffractive structure, a structural light pattern is produced.

15. The laser diode module according to claim 14, wherein the plural light beams emitted by the plural lighting chips comprise plural laser beams or plural laser-like beams, wherein the plural laser beams or laser-like beams have wavelengths in an ultraviolet band, a visible band, an infrared band, a near infrared band, a mid-infrared band, a thermal band or a combination thereof.

16. The laser diode module according to claim 14, wherein the plural light beams have wavelengths of a red light, a green light and a blue light.

17. The laser diode module according to claim 14, wherein the diffractive structure is a single-layered film, a multi-layered film or a composite film that is attached on the inner surface and/or the outer surface of the covering body, wherein the inner surface of the covering body faces the plural lighting chips, and the outer surface of the covering body is exposed outside.

18. The laser diode module according to claim 17, wherein the plural lighting chips are disposed on a mounting surface of the substrate, wherein if the diffractive structure is attached on the outer surface of the covering body, a distance between a climax of the diffractive structure and the mounting surface of the substrate is not larger than 3.0 mm, wherein if the diffractive structure is attached on the inner surface of the covering body, a distance between the outer surface of the covering body and the mounting surface of the substrate is not larger than 3.0 mm.

19. The laser diode module according to claim 14, wherein the optical member has a light outputting surface for the plural light beams, and a numerical aperture (NA) of the light outputting surface is smaller than 0.65.

20. The laser diode module according to claim 14, wherein the optical member has a light outputting surface for the plural light beams, and a numerical aperture (NA) of the light outputting surface is smaller than 0.5.

21. The laser diode module according to claim 14, wherein the optical axel of the plural lighting chips are in parallel with each other, or an included angle between every two adjacent ones of the plural optical axes is not larger than 5 degrees.

22. The laser diode module according to claim 21, wherein the optical member further comprises a wedge-bending light guider, wherein one of the diffractive structure and the wedge-bending light guider is disposed on the inner surface of the covering body, and the other of the diffractive structure and the wedge-bending light guider is disposed on the outer surface of the covering body, wherein the inner surface of the covering body faces the plural lighting chips, and the outer surface of the covering body is exposed outside, wherein an inclination angle of the wedge-bending light guider is smaller than 15 degrees.

23. The laser diode module according to claim 14, wherein a distance between every two adjacent ones of the lighting chips is smaller than 1.0 mm, or the plural lighting chips are arranged in a ring-shaped configuration with a diameter not larger than 5.0 mm.

24. The laser diode module according to claim 14, wherein the substrate further comprises a driving circuit for driving the plural lighting chips, wherein the plural lighting chips are synchronously or asynchronously driven by the driving circuit, so that a coverage range and a profile of the structural light pattern are changeable.

25. The laser diode module according to claim 24, wherein the structural light pattern is composed of random dots, symmetric non-interlaced stripes, asymmetric non-interlaced stripes, symmetric interlaced stripes or asymmetric interlaced stripes, wherein when the plural lighting chips are synchronously driven by the driving circuit, a density of the random dots is increased or a distribution range of the random dots is widened, a density of the symmetric non-interlaced stripes or a light stripe density or a distribution range of the asymmetric non-interlaced stripes is increased, and a density of the symmetric interlaced stripes or a light stripe density or a distribution range of the asymmetric interlaced stripes is increased.

26. The laser diode module according to claim 24, wherein the structural light pattern is composed of random dots, symmetric non-interlaced stripes, asymmetric non-interlaced stripes, symmetric interlaced stripes or asymmetric interlaced stripes, wherein when the plural lighting chips are asynchronously driven by the driving circuit, a viewing block corresponding to the structural light pattern is partially or completely scanned.

* * * * *